United States Patent
Joo et al.

(10) Patent No.: US 6,268,258 B1
(45) Date of Patent: Jul. 31, 2001

(54) METHOD FOR FABRICATING CAPACITOR IN SEMICONDUCTOR DEVICE

(75) Inventors: Jae Hyun Joo; Jong Bum Park, both of Chungcheongbuk-do (KR)

(73) Assignee: Hyundai Electronics Industries Co., Ltd., Kyoungki-Do (KR)

(*) Notice: Subject to any disclaimer, the term of this patent is extended or adjusted under 35 U.S.C. 154(b) by 0 days.

(21) Appl. No.: 09/558,213

(22) Filed: Apr. 26, 2000

(30) Foreign Application Priority Data

Oct. 1, 1999 (KR) .................................... 99-42405

(51) Int. Cl.$^7$ ..................................... H01L 21/20
(52) U.S. Cl. .................... 438/381; 438/239; 438/240; 438/253; 438/396
(58) Field of Search ..................... 438/381, 396, 438/239, 240, 253, 795

(56) References Cited

U.S. PATENT DOCUMENTS

| | | | |
|---|---|---|---|
| 5,554,559 | * | 9/1996 | Wolters et al. ................ 257/295 |
| 5,909,043 | * | 6/1999 | Summerfelt ................... 257/298 |
| 6,201,271 | * | 3/2001 | Okutoh et al. ................. 257/295 |

FOREIGN PATENT DOCUMENTS

| | | | |
|---|---|---|---|
| 689236 A1 | * | 12/1995 | (EP) . |
| 920061 A2 | * | 6/1999 | (EP) . |
| 960869 A2 | * | 12/1999 | (EP) . |

OTHER PUBLICATIONS

Byung Hak Lee et al., In–situ Barrier Formation for High Reliable W/barrier/poly–Si Gate Using Denudation of $WN_x$ on Polycrystalline Si, IEDM, 1998, pp. 385–388.

* cited by examiner

Primary Examiner—Trung Dang
(74) Attorney, Agent, or Firm—Morgan, Lewis & Bockius LLP

(57) ABSTRACT

A method for fabricating a capacitor in a semiconductor device, in which oxidization of upper and lower electrodes and wiring films is prevented during annealing a capacitor dielectric film for improving device characteristics, the capacitor having a lower electrode, a dielectric film formed on a surface of the lower electrode, and an upper electrode formed on the dielectric film, the method including the steps of: (1) forming the dielectric film of at least one oxide selected from a group of oxides of Lead (Pb), Zirconium (Zr), Tantalum (Ta), Barium (Ba), Strontium (Sr), and Titanium (Ti); (2) forming the upper electrode and the lower electrode of the capacitor with a metal having a standard Gibbs free energy greater than an oxide metal of the dielectric film; and (3) annealing to crystallize the dielectric film in an atmosphere of which partial pressure ratio of $P_{H2O}/P_{H2}$ is 10-20E~10E0.

16 Claims, 12 Drawing Sheets

Dielectric film Crystallization

Dielectric film crystallization

METHOD FOR FABRICATING CAPACITOR IN SEMICONDUCTOR DEVICE

This application claims the benefit of Korean patent application No. 42405/1999, filed Oct. 1, 1999, which is hereby incorporated by reference.

BACKGROUND OF THE INVENTION

1. Field of the Invention

The present invention relates to a semiconductor device, and more particularly, to a method for fabricating a capacitor in a semiconductor device, in which oxidization of upper and lower electrodes and wiring films is prevented during annealing a capacitor dielectric film for improving device characteristics.

2. Background of the Related Art

Methods for increasing a capacitance by forming a three dimensional capacitor electrode of a dielectric film of, such as $SiO_2$, $NO(Si_3N_4)$, $Ta_2O_5$, etc., have come to a limit as a semiconductor device packing density increases in a geometrical series. Recently, a method using a material of a high dielectric constant, such as BST (Barium Strontium Titanium Oxide), and PZT (Lead Zirconium Titanium Oxide) as the dielectric film has been suggested. The dielectric film of a high dielectric constant can lower fabrication costs and improve device reliability. However, because a direct deposition of the dielectric film of a high dielectric constant on a silicon substrate forms a silicon oxide film at an interface, which reduces total charge sharply, films with an excellent acid resisting property, such as Pt or Ir are used as the upper and lower electrodes of the dielectric film of a high dielectric constant. However, such use of Pt and Ir acts as a factor increasing product cost, since the Pt and Ir are not only expensive, but also difficult to use in fabrication processes, such as etching and etc. Moreover, since the electrodes of noble metals act as catalytic that decomposes $H_2$ molecule, which flows in an ILD(Inter Layer Dielectric) process or an IMD(Inter Metal Dielectric) process, into H atoms, the electrodes of noble metals accelerate degradation of the dielectric film of a high dielectric constant. Those methods for fabricating a capacitor of a dielectric film of a high dielectric constant in a semiconductor device have the following problems.

The degradation of the dielectric film caused by catalytic effect of the upper and lower electrodes of the capacitor deteriorates device reliability. The degradation of the dielectric film occurs, not only in the ILD or IMD process, but also in $H_2$ forming process by a flowing $H_2$ gas conducted for decreasing resistivity and improving transistor characteristics after a wiring process.

SUMMARY OF THE INVENTION

Accordingly, the present invention is directed to a method for fabricating a capacitor in a semiconductor device that substantially obviates one or more of the problems due to limitations and disadvantages of the related art.

An object of the present invention is to provide a method for fabricating a capacitor in a semiconductor device, in which oxidization of the upper or lower electrodes or wiring is prevented in annealing a capacitor dielectric film for improving a device characteristics.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

An object of the present invention is to provide a method for fabricating a capacitor in a semiconductor device, the capacitor having a lower electrode, a dielectric film formed on a surface of the lower electrode, and an upper electrode formed on the dielectric film, the method comprising the steps of: forming the dielectric film of at least one oxide selected from a group of oxides of Lead (Pb), Zirconium (Zr), Tantalum (Ta), Barium (Ba), Strontium (Sr), and Titanium (Ti); forming the upper electrode and the lower electrode of the capacitor with a metal having a standard Gibbs free energy greater than a oxide metal of the dielectric film; and, annealing to crystallize the dielectric film in an atmosphere of which partial pressure ratio of $P_{H2O}/P_{H2}$ is 10E-20 ~10E0.

Another object of the present invention is to provide a method for fabricating a capacitor in a semiconductor device, comprising the steps of: forming an interlayer insulating layer having a storage node contact hole on a semiconductor substrate; forming a contact plug layer filling the storage node contact hole; forming a lower electrode made of Tungsten in contact with the contact plug layer, and depositing BSTO to form a dielectric layer; crystallizing the dielectric film at a temperature of 700 K~1200 K in an atmosphere of which partial pressure ratio of $P_{H2O}/P_{H2}$ is 10E-20~10E0; and forming an upper electrode made of Tungsten on the dielectric layer.

Another object of the present invention is to provide a method for fabricating a capacitor in a semiconductor device, comprising the steps of: forming an interlayer insulating layer having a storage node contact hole on a semiconductor substrate; forming a contact plug layer filling the storage node contact hole; forming a lower electrode made of Tungsten in contact with the contact plug layer; depositing BSTO to form a dielectric layer; forming an upper electrode made of Tungsten on the dielectric layer; forming an ILD layer on an entire surface of the semiconductor substrate including the upper electrode; selectively etching the ILD layer to form a metal wiring contact hole; forming a metal wiring plug layer to fill the metal wiring contact hole; forming a metal wiring; forming an IMD layer on an entire surface of the ILD layer including the metal wiring; and crystallizing the dielectric film while at the same time annealing the metal wiring at a temperature of 700 K~1200 K in an atmosphere of which partial pressure ratio of $P_{H2O}/PH_2$ is 10E-20~10E0.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENT

Reference will now be made in detail to the preferred embodiments of the present invention, examples of which are illustrated in the accompanying drawings.

Figure 1:
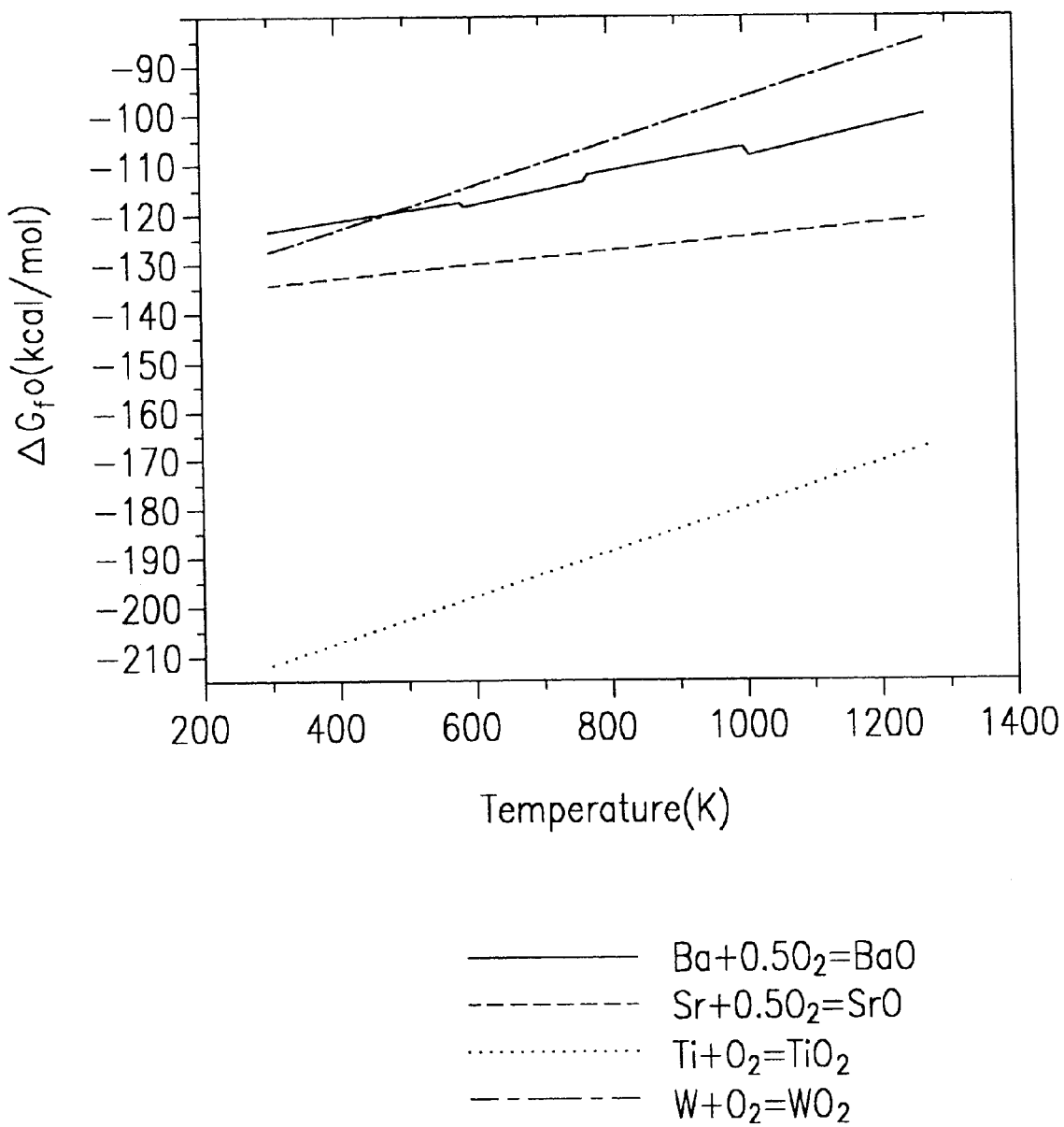
FIG. 1 illustrates a graph showing oxidation reactivities of Ba, Sr, Ti, and W in $O_2$ atmosphere.
Figure 2:
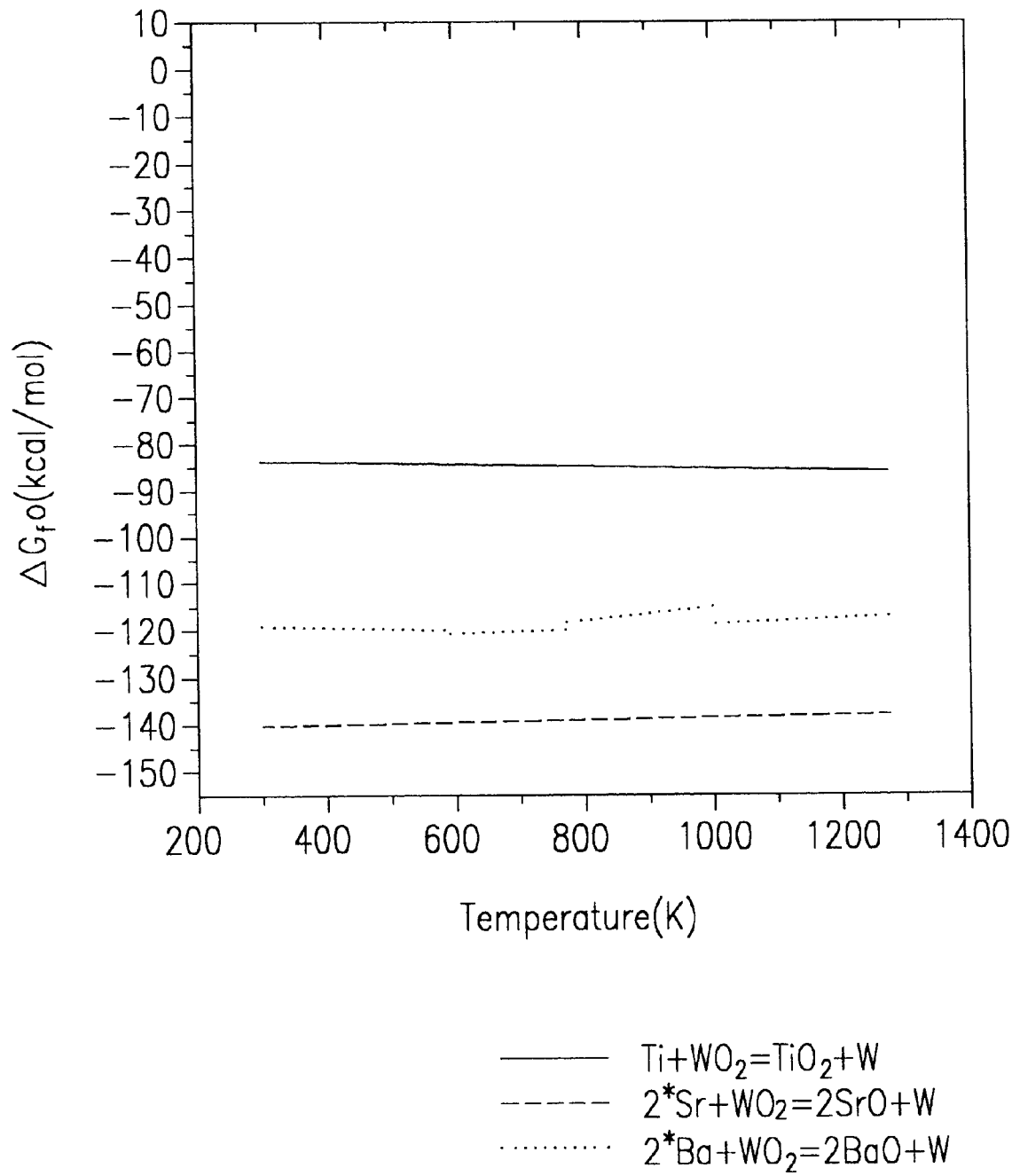
FIG. 2 illustrates a graph showing relative oxidation stabilities of Ba, Sr, and Ti to W.

FIG. 1 illustrates a graph showing oxidation reactivities of Ba, Sr, Ti, and W in $O_2$ atmosphere, and FIG. 2 illustrates a graph showing relative oxidation stabilities of Ba, Sr, and Ti to W. A method for fabricating a capacitor in a semiconductor device of the present invention facilitates use of a material that can be applied to mass production, such as Tungsten (W), as the upper and lower electrodes of a capacitor which uses a high dielectric constant material, such as BST and PZT, as a dielectric film. That is, the dielectric film is deposited at a low temperature, and crystallized in a mixed gas atmosphere of water vapor/hydrogen, to oxidize the dielectric film selectively, without oxidizing Tungsten. In general, a BST film deposited at a low temperature has amorphous coupling of Ba—O, Sr—O, and Ti—O. FIG. 1 illustrates Gibbs free Energy representing oxidation stabilities of a dielectric layer and electrode layers when the dielectric layer and electrode layers are exposed to $O_2$ atmosphere, wherein all of Ba, Sr, Ti, and W are liable to form oxides when exposed to $O_2$ atmosphere. The oxidation stabilities of the oxides are represented as follows.

$TiO_2>SrO>BaO\sim WO_2$

FIG. 2 illustrates relative oxidation stabilities of Ba, Sr, and Ti to W based on the oxidation stabilities in FIG. 1. As shown in FIG. 2, Ba, Sr, and Ti are oxidized into BaO, SrO, and $TiO_2$, respectively, when Ba, Sr, and Ti come in contact with $WO_2$, while $WO_2$ is reduced into W. As shown in FIGS. 1 and 2, there is a region in which oxides of Ba, Sr, and Ti are formed without oxidizing W when oxygen is used in the oxidation process. However, the slight difference of Gibbs Free Energy between oxidation of Ba, Sr, and Ti and W, respectively, causes a low reliability due to a small process window.

Figure 3:
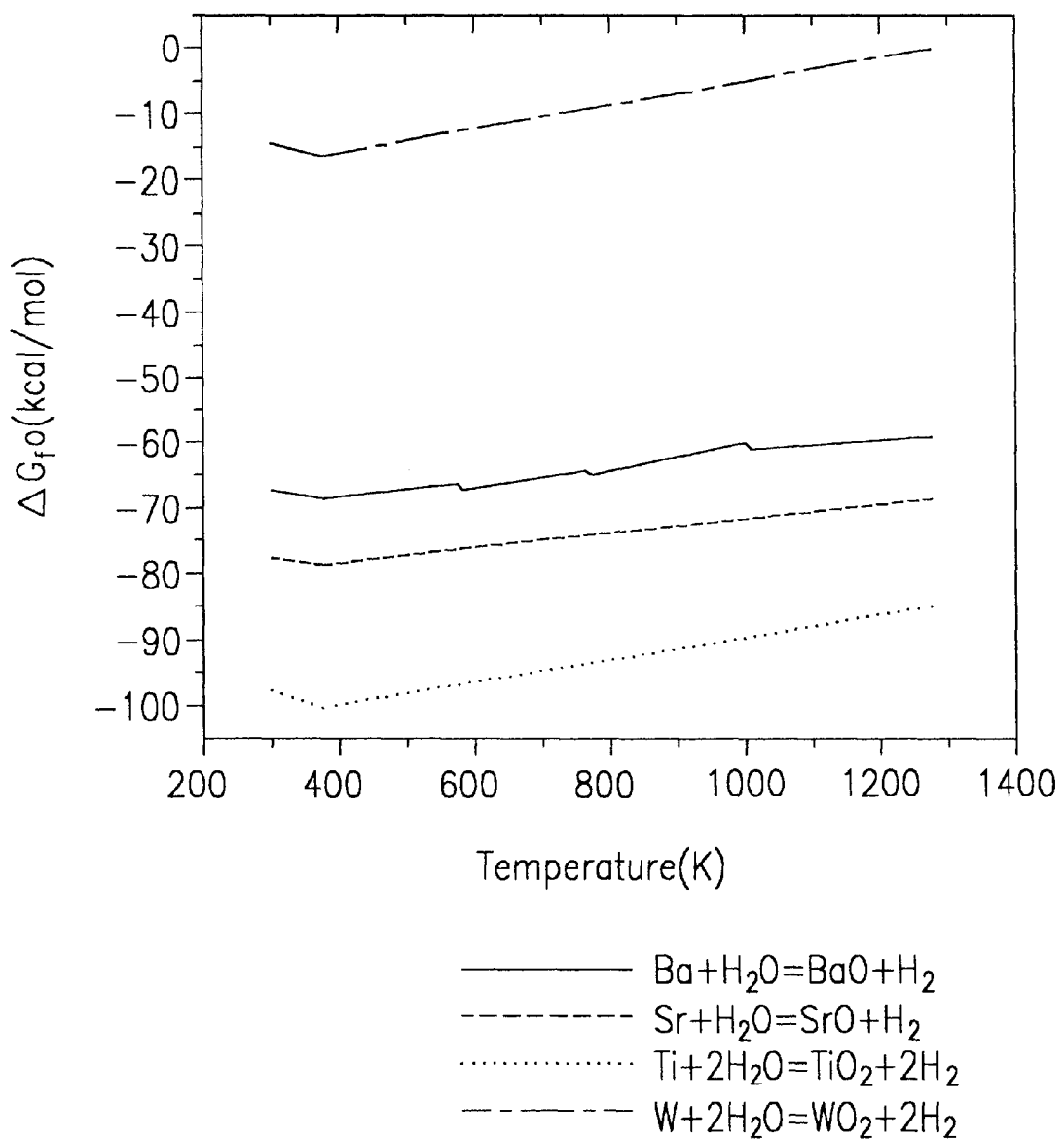
FIG. 3 illustrates a graph showing oxidation reactivities of Ba, Sr, Ti, and W in $H_2O/H_2$ atmosphere.
Figure 4:
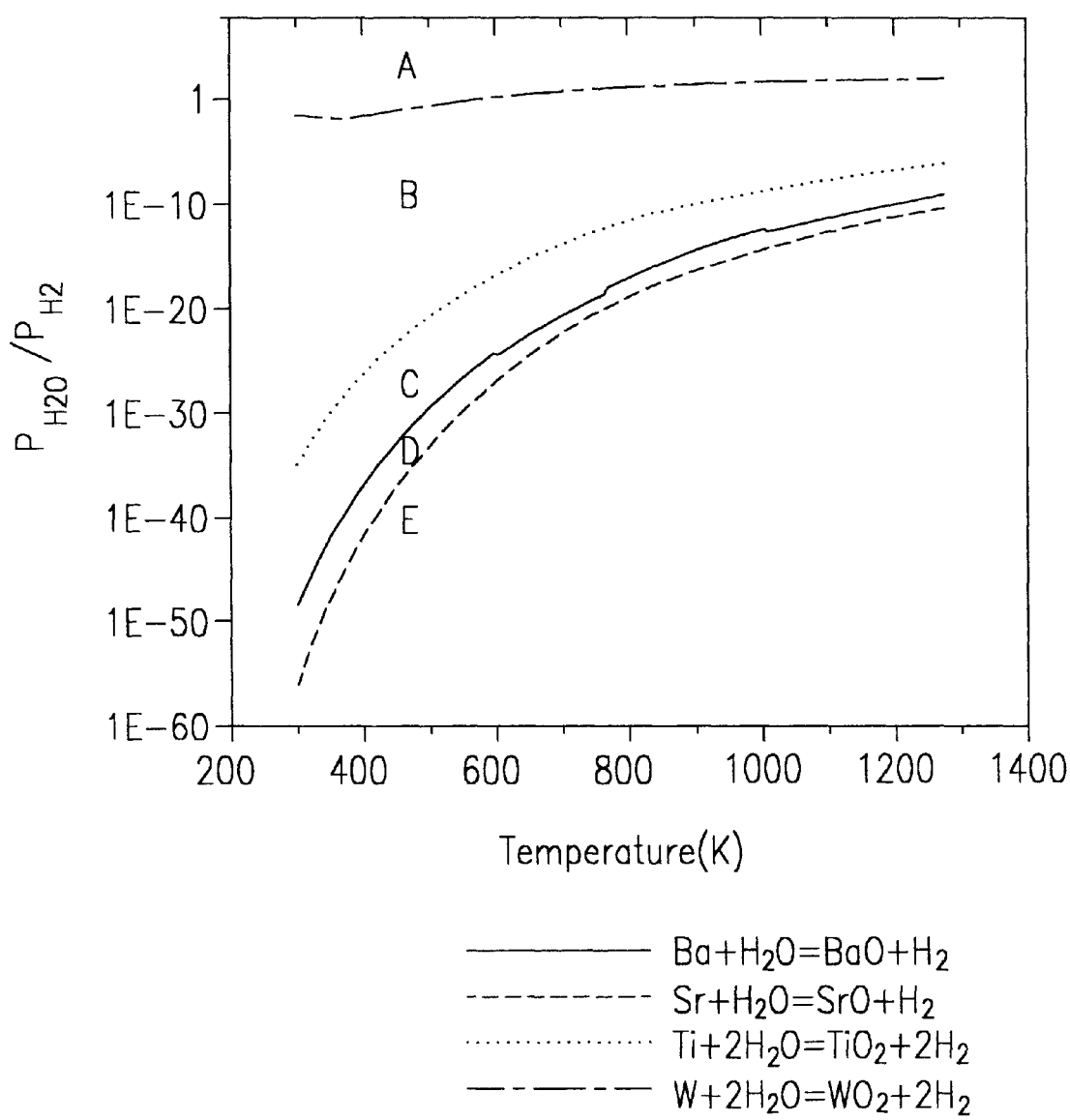
FIG. 4 illustrates a graph showing oxidation stabilities of Ba, Sr, Ti, and W depending on partial pressures of $H_2O$ and $O_2$ and a temperature.

FIG. 3 illustrates a graph showing oxidation reactivities of Ba, Sr, Ti, and W in $H_2O/H_2$ atmosphere, instead of the oxygen atmosphere, and FIG. 4 illustrates a graph showing oxidation stabilities of Ba, Sr, Ti, and W depending on partial pressures of $H_2O$ and $O_2$ and a temperature.

Referring to FIG. 3, the stabilities of BaO, SrO, and $TiO_2$ to $WO_2$ are increased significantly when the oxidation is conducted in $H_2O/H_2$ atmosphere than conducted in $O_2$ atmosphere. This increase in the oxidation stabilities implies that oxidation conducted in $H_2O/H_2$ atmosphere is better in maintaining BSTO (Barium Strontium Titanium Oxide) in oxide state without oxidizing Tungsten than the oxidation conducted in oxygen.

FIG. 4 illustrates a graph showing oxidation stabilities of Ba, Sr, Ti, and W depending on partial pressures of $H_2O$ and $O_2$ and a temperature.

Referring to FIG. 4, even though oxides of WOx, BaO, SrO, and TiO2 are stable in A region where $H_2O$ partial pressure is high, W, which is the most liable to oxidize, is oxidized for the first time and Ti, Ba, and Sr are reduced in the order as $H_2$ partial pressure is increased. Stable phases of Ba, Sr, Ti, and W in regions of A, B, C, D, and E in FIG. 4 depending on partial pressures of $H_2O$ and $O_2$ and the temperature are as follows: Ba, Sr, Ti, and W are in BaO, SrO, $TiO_2$, and WOx states, respectively, in A region; in BaO, SrO, $TiO_2$, and W states, respectively, in B region; in Ba, SrO, $TiO_2$, and W states, respectively, in C region; in Ba, Sr, $TiO_2$, and W states, respectively, in D region; and in Ba, Sr, Ti, and W states, respectively, in E region. This implies that an optimal capacitor can be formed in the condition of the partial pressures of $H_2O$ and $O_2$ and temperature of the B region.

Figure 5:
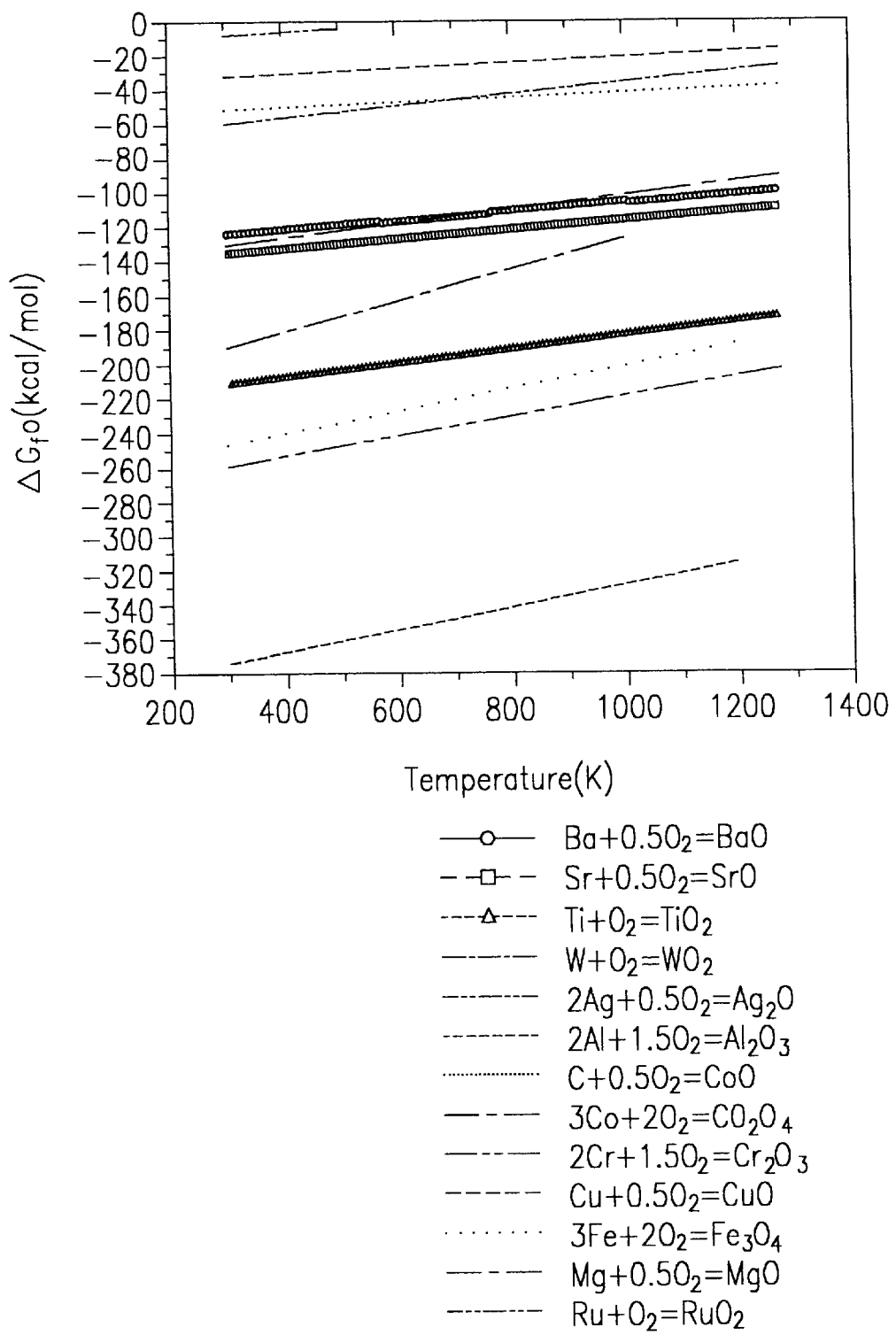
FIG. 5 illustrates a graph showing stabilities of oxides of metals other than Ba, Sr, Ti, and W.

FIG. 5 illustrates a graph showing oxidation stabilities of metals other than Ba, Sr, Ti, and W.

As shown in FIG. 5, metals, such as Ag, Co, and Cu, can be selectively oxidized while the electrode is not oxidized, and BSTO is maintained in oxide state. The Ag, Co, and Cu are metals with a standard Gibbs free energy relatively higher than Ba, Sr, and Ti, in forming of oxides. The BSTO film is degraded in following ILD or IMD process, causing poor electrical characteristics. However, it can be restored by using Cu, instead of Al, in metallization process, in addition to general advantages, such as improvement in electric conductivity and electromigration.

FIGS. 6A~6G illustrate sections showing the steps of a method for fabricating a capacitor in a semiconductor device in accordance with a preferred embodiment of the present invention. The method for fabricating a capacitor in a semiconductor device in accordance with the preferred embodiment of the present invention suggests to crystallize a dielectric film under a state in which a metal state of lower electrode and oxide state of the dielectric film are stable by adjusting oxygen and water vapor partial pressures after the dielectric film is deposited on the lower electrode.

Figure 6A:
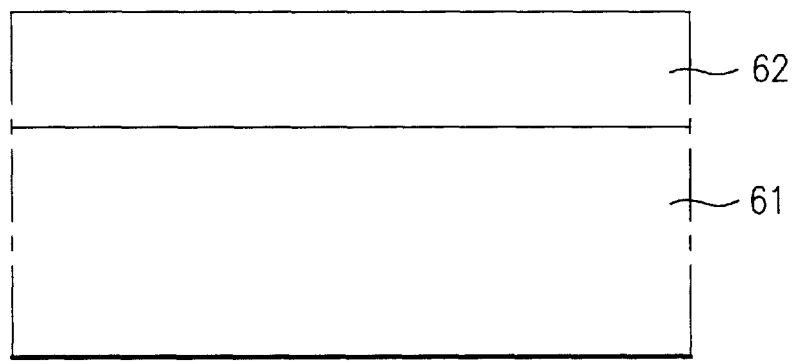
FIGS. 6A~6G illustrate sections showing the steps of a method for fabricating a capacitor in a semiconductor device in accordance with a preferred embodiment of the present invention; and, FIGS. 7A~7I illustrate sections showing the steps of a method for fabricating a capacitor in a semiconductor device in accordance with another preferred embodiment of the present invention.

Referring to FIG. 6A, an interlayer insulating layer 62 is formed on an entire surface of a semiconductor substrate 61 having cell transistors(not shown) formed thereon.

Figure 6B:
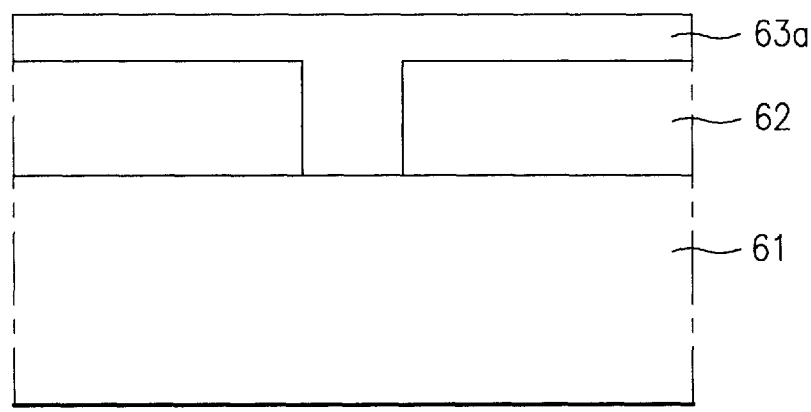

Then, as shown in FIG. 6B, the interlayer insulating layer 62 is selectively etched, to form a storage node contact. And, a polysilicon film, which has an excellent step coverage, is deposited on an entire surface including the storage node contact hole as a plug forming material layer 63a.

Figure 6C:
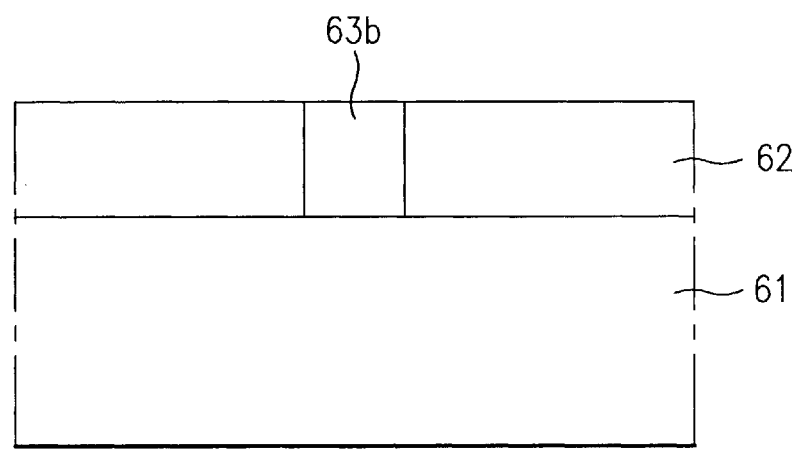

Then, as shown in FIG. 6C, the plug forming material layer 63a is subjected to CMP (Chemical Mechanical Polishing) or etch back, only to leave it in the storage node contact hole, to form a contact plug layer 63b.

Figure 6D:
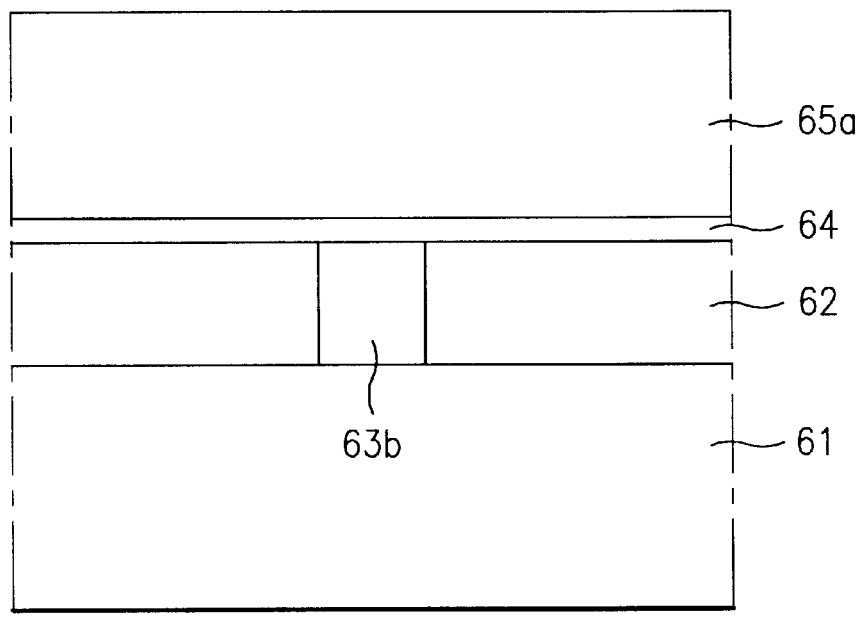

And, as shown in FIG. 6D, a barrier layer 64 for improving a contact characteristic between the contact plug layer 63b and a lower electrode forming material layer, and the lower electrode forming material layer 65a are formed in succession. The barrier layer 64 is formed of TiNx, TaNx, Ti—Si—N or the like, and the lower electrode forming material layer 65a is formed of Tungsten. The metal of the lower electrode forming material layer 65a should have a standard Gibbs free energy greater than oxide films of metals used in following formation of dielectric film, typically Co, Ag, or Ru.

Figure 6E:
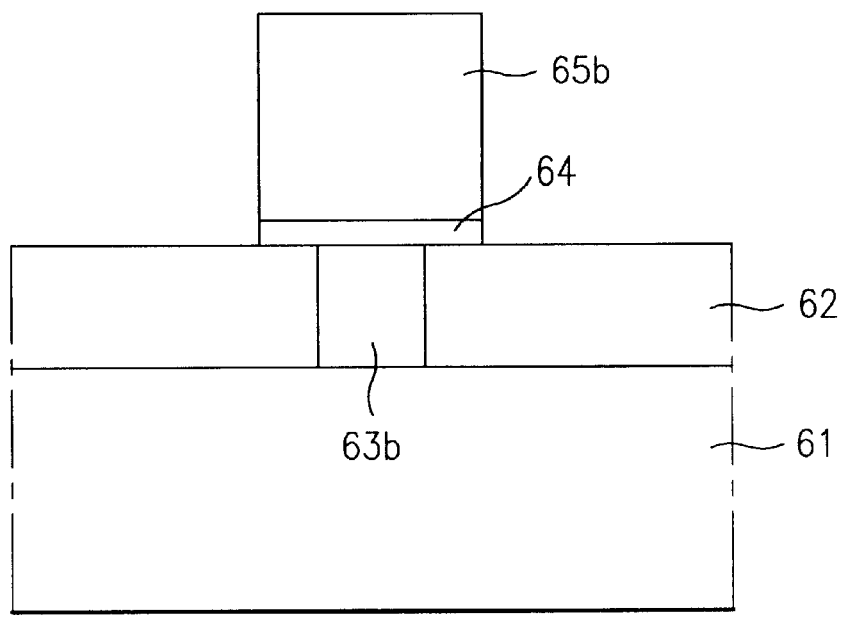

Then, as shown in FIG. 6E, the lower electrode forming material layer 65a, and the barrier layer 64 are selectively patterned, to form a lower electrode 65b of the capacitor.

Figure 6F:
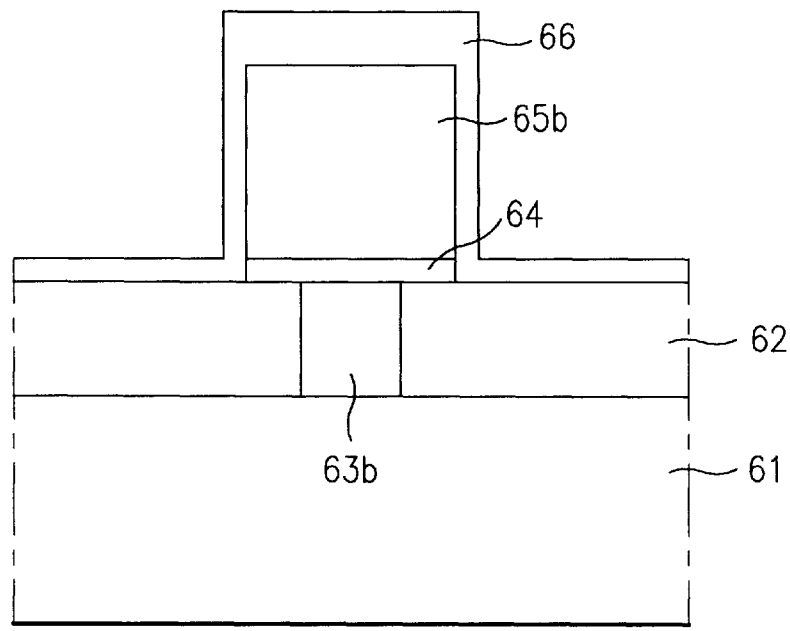

As shown in FIG. 6F, a dielectric layer 66 of a material, such as BSTO, is formed on an entire surface including the lower electrode 65b. The dielectric layer 66 is formed of oxide consisting at least one of Pb, Zr, Ta, Ba, Sr, and Ti. The dielectric layer 66 is deposited at a low temperature for better step coverage and to prevent the oxidation of the lower electrode. Then, the dielectric layer 66 is crystallized. The crystallization of the dielectric layer 66 should be conducted under conditions in which the oxidation of the lower electrode 65b is suppressed, and oxide film is in stable state. For example, because the BSTO film deposited at lower temperature is in amorphous state, the BSTO film requires annealing at a temperature of 600~700° C. (an optimal temperature in a case Tungsten is used as an electrode) for forming a Petrovskite phase which has a high dielectric constant. Such crystallization is conducted in a condition of region B in FIG. 4, in which Tungsten is not oxidized and the BSTO oxide film is stable. If the upper and lower electrodes are formed of Co, Ag, or Ru (metals having a standard Gibbs free energy greater than the dielectric film) including Tungsten, the dielectric film crystallization is conducted with annealing at a temperature of 700 K~1200 K in an atmosphere of which partial pressure ratio of $P_{H2O}/P_{H2}$ is 10E-20~10E0.

Figure 6G:
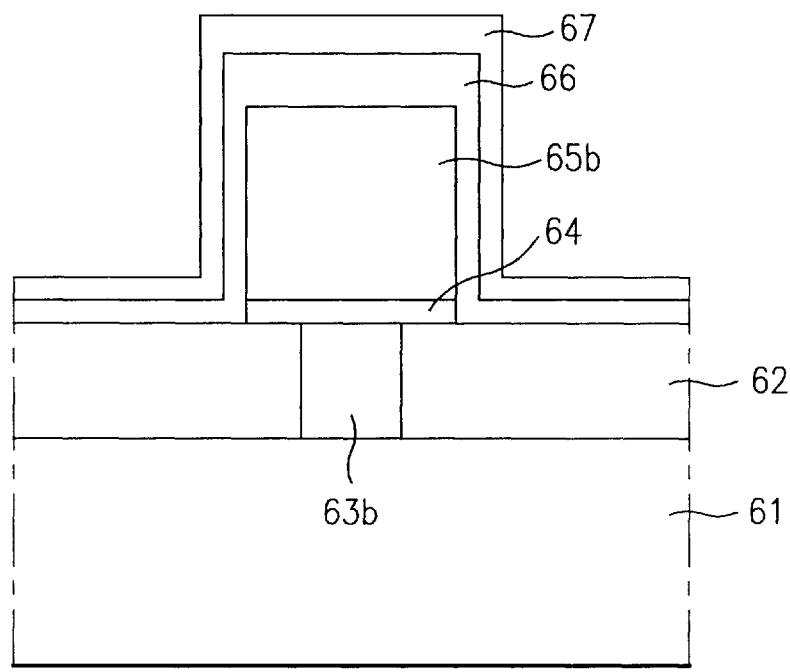

Then, as shown in FIG. 6G, the upper electrode 67 is formed on the dielectric layer 66. Like the lower electrode 65b, the upper electrode 67 may be formed of Tungsten or a metal having a standard Gibbs free energy greater than the dielectric film. Then, though not shown, an ILD layer, metal wiring of Cu or the like, and an IMD layer are formed in succession.

A method for fabricating a capacitor in a semiconductor device in accordance with another preferred embodiment of the present invention will be explained. FIGS. 7A~7I illustrate sections showing the steps of a method for fabricating a capacitor in a semiconductor device in accordance with another preferred embodiment of the present invention.

In a case when, for example, BSTO film is employed as a dielectric film, generally the dielectric film is degraded during deposition of upper electrode, deposition of oxide film, such as IMD layer or ILD layer, or forming of a metal wiring. In order to solve this problem, in this preferred embodiment the dielectric film crystallization is conducted after the IMD layer is formed, instead of after the formation of the lower electrode.

Figure 7A:
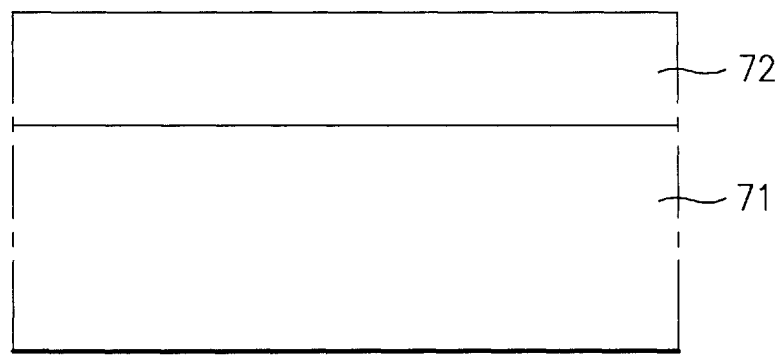

Referring to FIG. 7A, the method for fabricating a capacitor in a semiconductor device in accordance with another preferred embodiment of the present invention starts with forming an interlayer insulating film 72 on an entire surface of a semiconductor substrate 71 having cell transistors (not shown) formed thereon.

Figure 7B:
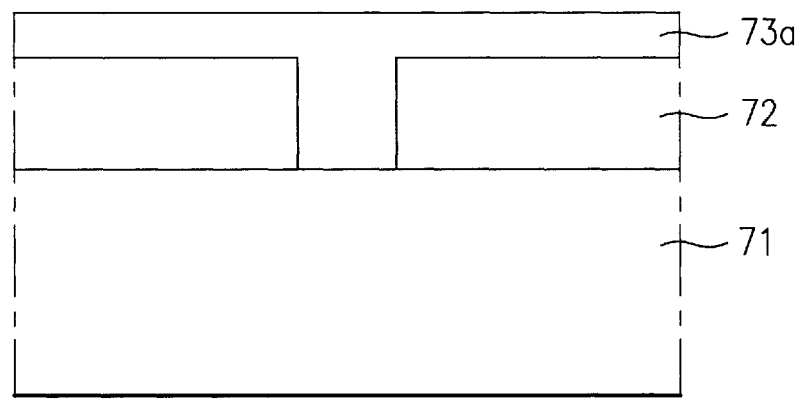

Then, as shown in FIG. 7B, the interlayer insulating layer is etched selectively, to form a storage node contact hole. A polysilicon film, which has an excellent step coverage, is deposited on an entire surface including the storage node contact as a plug forming material layer 73a.

Figure 7C:
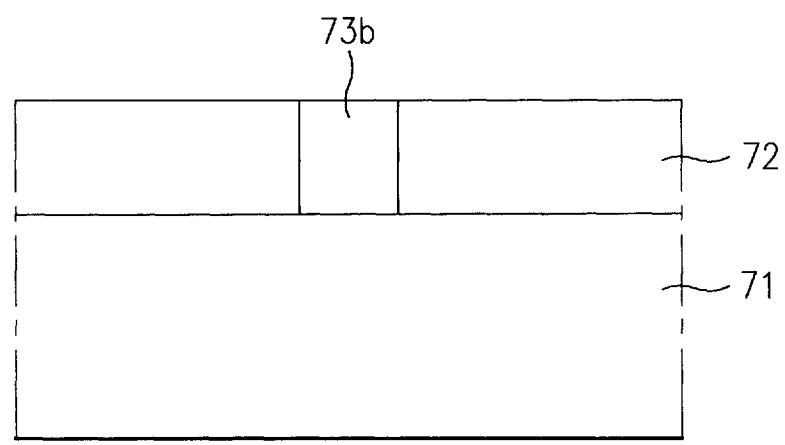

Then, as shown in FIG. 7C, the plug forming material layer 73a is subjected to CMP or etch back, to leave only in the storage node contact hole, to form a contact plug layer 73b.

Figure 7D:
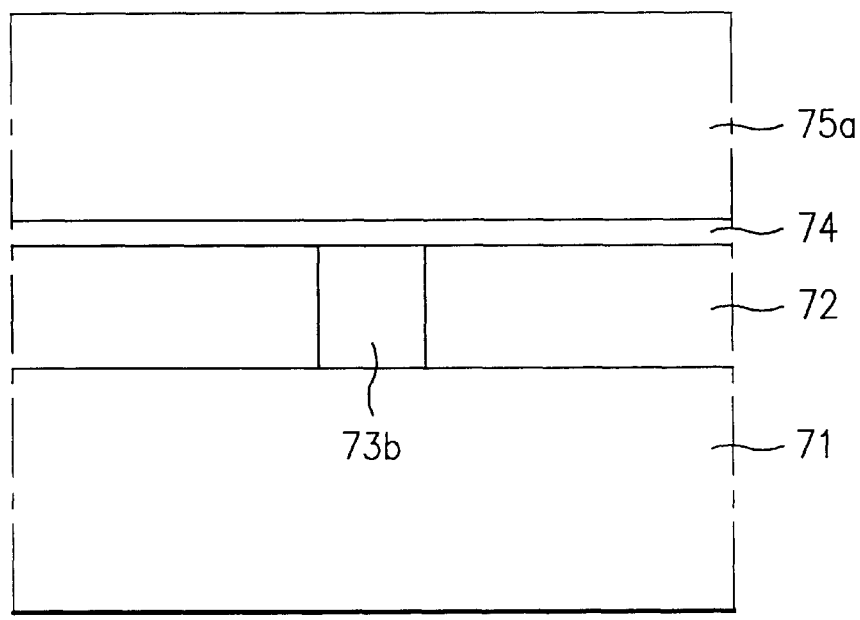

As shown in FIG. 7D, a barrier layer 74 for improving a contact characteristic between the contact plug layer 73b and a lower electrode forming material layer, and the lower electrode forming material layer 75a are formed in succession. The barrier layer 74 is formed of TiNx, TaNx, Ti—Si—N or the like, and the lower electrode forming material layer 75a is formed of Tungsten. Instead of Tungsten, the metal of the lower electrode forming material layer 75a can be formed of the metal having a standard Gibbs free energy greater than oxide films of metals used in following formation of dielectric film, typically Co, Ag, or Ru.

Figure 7E:
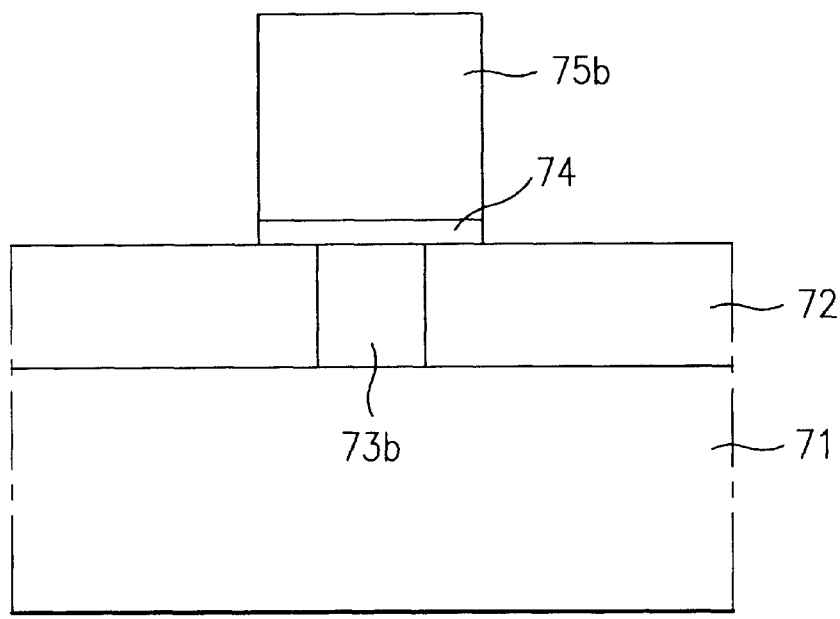

Then, as shown in FIG. 7E, the lower electrode forming material layer 75a, and the barrier layer 74 are selectively patterned, to form a lower electrode 75b of the capacitor.

Figure 7F:
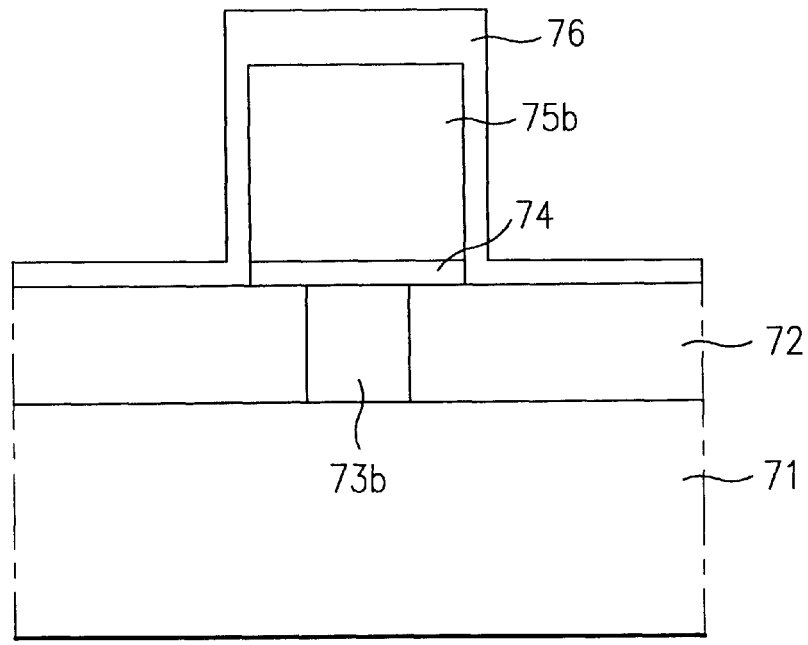

As shown in FIG. 7F, a dielectric layer 76 of a material, such as BSTO, is formed on an entire surface including the lower electrode 75b. The dielectric layer 76 is formed of an oxide including at least one of Pb, Zr, Ta, Ba, Sr, and Ti. And, the dielectric layer 76 is deposited at a low temperature for better step coverage and to prevent the oxidation of the lower electrode.

Figure 7G:
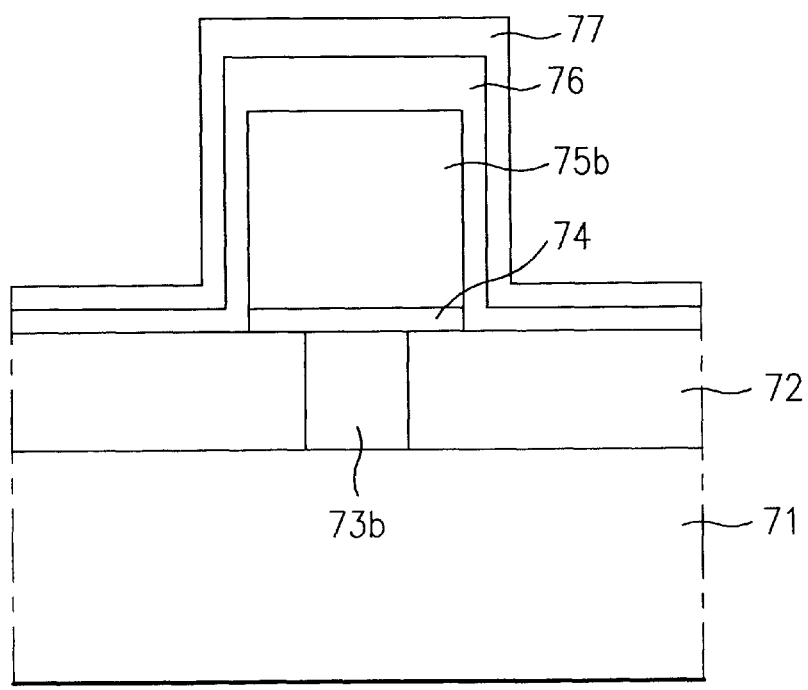

Then, as shown in FIG. 7G, an upper electrode 77 is formed on the dielectric layer 76. Like the lower electrode 75b, the upper electrode is formed of Tungsten or a metal having a standard Gibbs free energy greater than the dielectric film.

Figure 7H:
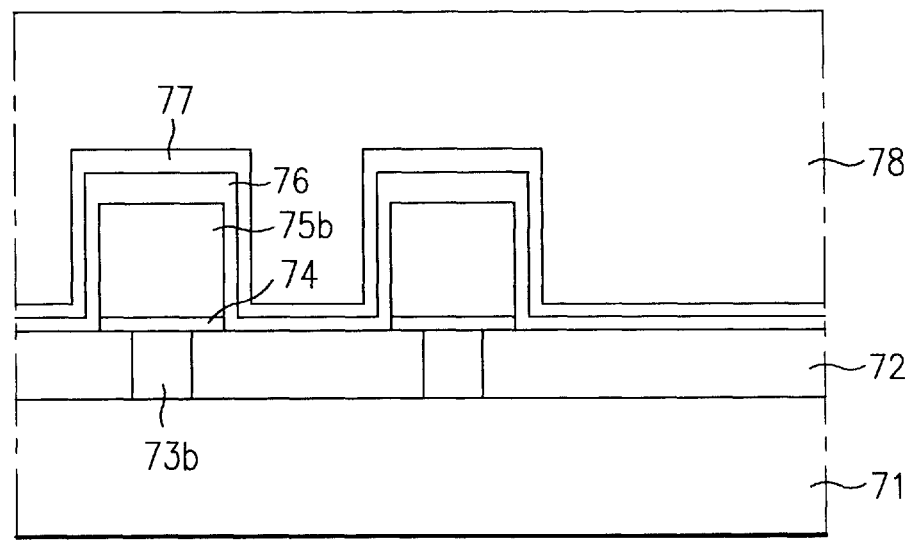

As shown in FIG. 7H, an ILD layer 78 is formed on an entire surface having the cell transistor and the capacitor formed thereon.

Figure 7I:
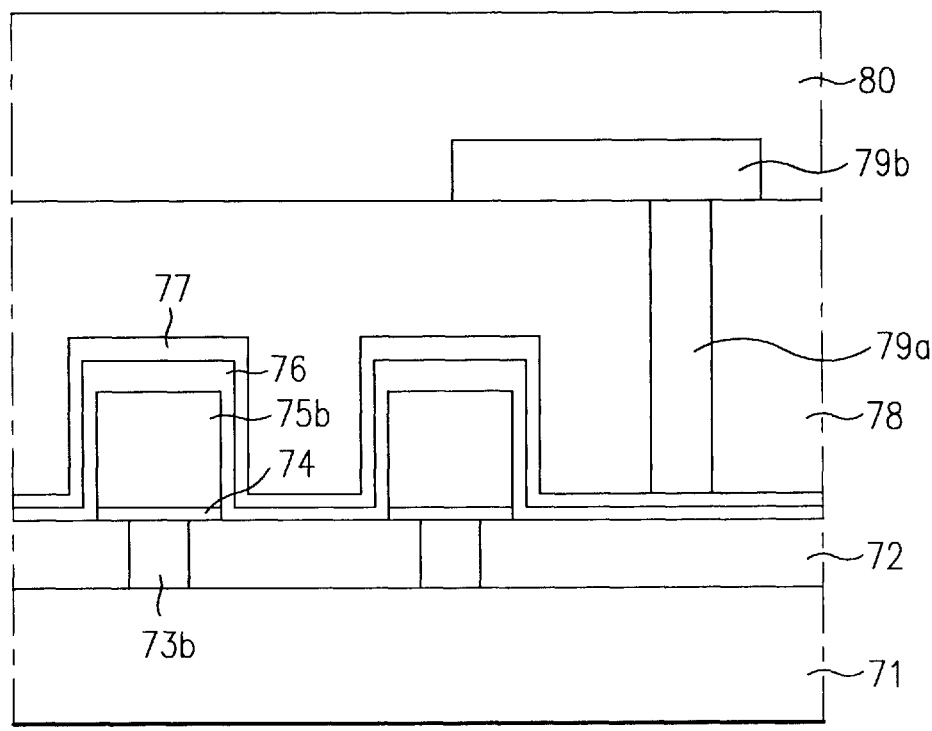

Then, as shown in FIG. 7I, the ILD layer is etched selectively, to form a metal wiring contact hole. And, a metal wiring plug layer 79a for stuffing the metal wiring contact hole and metal wiring 79b are formed of Al or Cu. Then, an IMD layer 80 is formed on an entire surface, including the metal wiring 79b. The dielectric layer 66 is crystallized and at the same time, the metal wiring is annealed under a stabilized condition in which the metal wiring 79b and the upper electrode 77 are not oxidized. The crystallization of the dielectric layer 76 should be conducted under conditions in which the oxidations of the lower electrode 75b, the upper electrode 77, and the metal wiring 79b are suppressed, and the oxide state of the dielectric layer is stabilized. For example, because the BSTO film deposited at lower temperature is in amorphous state, the BSTO film requires annealing at a temperature of 600~700° C. (an optimal temperature in a case Tungsten is used as an electrode) for forming a Petrovskite phase which has a high dielectric constant. Such crystallization is conducted in a condition of region B in FIG. 4, in which Tungsten is not oxidized and the BSTO oxide film is stable. If the upper and lower electrodes are formed of Co, Ag, or Ru (metals having a standard Gibbs free energy greater than the dielectric film) including Tungsten, the dielectric film crystallization is conducted with annealing at a temperature of 700 K~1200 K in an atmosphere of which partial pressure ratio of $P_{H2O}/P_{H2}$ is 10E-20~10E0. Thus, the dielectric film is formed after the upper electrode forming material layer is deposited, after the upper electrode is patterned, or after the ILD layer is deposited, depending on fabrication condition, not after the IMD layer is formed.

The method for fabricating a capacitor in a semiconductor device of the present invention can prevent degradation of the dielectric layer by conducting a following annealing for crystallizing the dielectric layer under a stabilized state of the dielectric layer without oxidizing the electrodes and wiring material, thereby improving a device reliability.

It will be apparent to those skilled in the art that various modifications and variations can be made in the method for fabricating a capacitor in a semiconductor device of the present invention without departing from the spirit or scope of the invention. Thus, it is intended that the present invention cover the modifications and variations of this invention provided they come within the scope of the appended claims and their equivalents.

What is claimed is:

1. A method for fabricating a capacitor in a semiconductor device, the capacitor having a lower electrode, a dielectric film formed on a surface of the lower electrode, and an upper electrode formed on the dielectric film, the method comprising the steps of:

(1) forming the dielectric film of at least one oxide selected from a group of oxides of Lead (Pb), Zirconium (Zr), Tantalum (Ta), Barium (Ba), Strontium (Sr), and Titanium (Ti);

(2) forming the upper electrode and the lower electrode of the capacitor with a metal having a standard Gibbs free energy greater than a oxide metal of the dielectric film; and, (3) annealing to crystallize the dielectric film in an atmosphere of which partial pressure ratio of $P_{H2O}/P_{H2}$ is 10E-20~10E0.

2. The method as claimed in claim 1, wherein the step of annealing is conducted before the upper electrode is formed.

3. The method as claimed in claim 1, wherein the step of annealing is conducted after the upper electrode is formed.

4. The method as claimed in claim 1, wherein the upper electrode and the lower electrode of the capacitor are formed of Tungsten (W), Cobalt (Co), Silver (Ag), or Ruthenium (Ru).

5. The method as claimed in claim 1, wherein the step of annealing is conducted at 600~700° C., when the dielectric film is formed of BSTO and the upper electrode and the lower electrode are formed of Tungsten (W).

6. A method for fabricating a capacitor in a semiconductor device, comprising the steps of:

(1) forming an interlayer insulating layer having a storage node contact hole on a semiconductor substrate;

(2) forming a contact plug layer filling the storage node contact hole;

(3) forming a lower electrode made of Tungsten in contact with the contact plug layer, and depositing BSTO to form a dielectric layer;

(4) crystallizing the dielectric layer at a temperature of 700 K~1200 K in an atmosphere of which partial pressure ratio of $P_{H2O}/P_{H2}$ is 10E-20~10E0; and, (5) forming an upper electrode made of Tungsten on the dielectric layer.

7. The method as claimed in claim 6, wherein the step of forming a contact plug layer includes the steps of;

depositing the contact plug layer on an entire surface of the interlayer insulating layer including the storage node contact hole, and subjecting the contact plug layer to CMP or etch back, to leave it only in the storage node contact hole.

8. The method as claimed in claim 6, further comprising the step of forming a barrier layer of TiNx, TaNx, or Ti—Si—N between the contact plug layer and a lower electrode forming material layer.

9. The method as claimed in claim 6, wherein the dielectric layer is formed of at least one oxide selected from a group of oxides of Lead (Pb), Zirconium (Zr), Tantalum (Ta), Barium (Ba), Strontium (Sr), and Titanium (Ti).

10. The method as claimed in claim 6, wherein the upper electrode and the lower electrode of the capacitor are formed of a metal selected from Cobalt (Co), Silver (Ag), or Ruthenium (Ru), having a standard Gibbs free energy greater than a oxide metal of the dielectric film.

11. A method for fabricating a capacitor in a semiconductor device, comprising the steps of:

(1) forming an interlayer insulating layer having a storage node contact hole on a semiconductor substrate;

(2) forming a contact plug layer filling the storage node contact hole;

(3) forming a lower electrode made of Tungsten in contact with the contact plug layer;

(4) depositing BSTO to form a dielectric layer;

(5) forming an upper electrode made of Tungsten on the dielectric layer;

(6) forming an ILD layer on an entire surface of the semiconductor substrate including the upper electrode;

(7) selectively etching the ILD layer to form a metal wiring contact hole;

(8) forming a metal wiring plug layer to fill the metal wiring contact hole;

(9) forming a metal wiring;

(10) forming an IMD layer on an entire surface of the ILD layer including the metal wiring; and,

(11) crystallizing the dielectric film, while at the same time annealing the metal wiring at a temperature of 700 K~1200 K in an atmosphere of which partial pressure ratio of $PH_{2O}P_{H2}$ is 10E-20~10E0.

12. The method as claimed in claim 11, wherein the step of forming a contact plug layer includes the steps of;

depositing the contact plug layer on an entire surface of the interlayer insulating layer including the storage node contact hole, and subjecting the contact plug layer to CMP or etch back to leave it only in the storage node contact hole.

13. The method as claimed in claim 11, further comprising the step of forming a barrier layer of TiNx, TaNx, or Ti—Si—N between the contact plug layer and a lower electrode forming material layer.

14. The method as claimed in claim 11, wherein the dielectric layer is formed of at least one oxide selected from a group of oxides of Lead (Pb), Zirconium (Zr), Tantalum (Ta), Barium (Ba), Strontium (Sr), and Titanium (Ti).

15. The method as claimed in claim 11, wherein the metal wiring is formed of metal, such as Aluminum (Al) or Copper (Cu).

16. The method as claimed in claim 11, wherein the step of crystallizing the dielectric film is conducted after the upper electrode is formed or after the ILD layer is formed.

* * * * *